(12) United States Patent
Zhang et al.

(10) Patent No.: US 12,484,346 B2
(45) Date of Patent: Nov. 25, 2025

(54) LIGHT EMITTING DIODE DEVICES WITH BONDING AND/OR OHMIC CONTACT-REFLECTIVE MATERIAL

(71) Applicant: Lumileds LLC, San Jose, CA (US)

(72) Inventors: Wali Zhang, Singapore (SG); Zhan Hong Cen, Singapore (SG); Wee-Hong Ng, Singapore (SG); Yeow Meng Teo, Singapore (SG)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 576 days.

(21) Appl. No.: 17/901,280

(22) Filed: Sep. 1, 2022

(65) Prior Publication Data
US 2023/0074920 A1    Mar. 9, 2023

Related U.S. Application Data

(60) Provisional application No. 63/240,588, filed on Sep. 3, 2021.

(51) Int. Cl.
*H10H 20/832* (2025.01)
*H10H 20/01* (2025.01)
(Continued)

(52) U.S. Cl.
CPC ........ *H10H 20/835* (2025.01); *H10H 20/821* (2025.01); *H10H 20/825* (2025.01); *H10H 29/142* (2025.01); *H10H 20/032* (2025.01)

(58) Field of Classification Search
CPC .. H10H 20/835; H10H 20/821; H10H 20/825; H10H 29/142; H10H 20/032;
(Continued)

(56) References Cited

U.S. PATENT DOCUMENTS 6,410,942 B1    6/2002 Thibeault et al.
6,573,537 B1    6/2003 Steigerwald et al.
(Continued)

FOREIGN PATENT DOCUMENTS

DE    102010051286 A1    5/2012
DE    102012109460 A1    4/2014
(Continued)

OTHER PUBLICATIONS

PCT International Search Report and Written Opinion in PCT/US2022/042413 dated Dec. 22, 2022, 10 pages.
(Continued)

*Primary Examiner* — Thanh T Nguyen
(74) *Attorney, Agent, or Firm* — SERVILLA WHITNEY LLC

(57) ABSTRACT

A metal stack of layers contacting an N-type layer of a light emitting diode (LED) device comprises: an ohmic contact layer electrically contacting the N-type layer and having a work function value that is less than or equal to a work function value of the N-type layer; a reflective layer electrically contacting the ohmic contact layer; a first material barrier layer electrically contacting the reflective layer; a current carrying layer electrically contacting the first material barrier layer; and a second material barrier layer electrically contacting the current carrying layer. LED devices incorporate the metal stack of layer as a bonding material and/or as an ohmic contact-reflective material. Methods of making and using the metal stacks and LED devices are also provided.

18 Claims, 5 Drawing Sheets

(51) Int. Cl.
*H10H 20/821* (2025.01)
*H10H 20/825* (2025.01)
*H10H 29/14* (2025.01)

(58) Field of Classification Search
CPC .. H10H 20/034; H10H 20/0364; H10H 20/84; H10H 20/018; H10H 20/8312; H10H 20/857
See application file for complete search history.

(56) References Cited

U.S. PATENT DOCUMENTS

| | | | |
|---|---|---|---|
| 6,657,236 | B1 | 12/2003 | Thibeault et al. |
| 6,821,804 | B2 | 11/2004 | Thibeault et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,890,111 | B2 | 11/2014 | Templier et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,964,845 | B2 | 3/2021 | Dimitropoulos et al. |
| 2006/0081869 | A1 | 4/2006 | Lu et al. |
| 2009/0184329 | A1 | 7/2009 | Miki et al. |
| 2011/0151607 | A1 | 6/2011 | Landis et al. |
| 2011/0287606 | A1 | 11/2011 | Brun et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0200230 | A1 | 7/2015 | Jang et al. |
| 2015/0228873 | A1 | 8/2015 | Gebuhr et al. |
| 2015/0280060 | A1 | 10/2015 | Gilet et al. |
| 2015/0349195 | A1 | 12/2015 | Yu |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0293065 | A1 | 10/2017 | Kim |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0182921 | A1* | 6/2018 | Jang ............... H10H 20/831 |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2008192710 A | 8/2008 |
| JP | 2016066765 A | 4/2016 |
| JP | 6165602 B2 | 7/2017 |
| JP | 2018125457 A | 8/2018 |
| KR | 20120052565 A | 5/2012 |
| KR | 20140118466 A | 10/2014 |
| KR | 20160115307 A | 10/2016 |
| KR | 20170018687 A | 2/2017 |
| KR | 101797598 B1 | 11/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2006138465 A2 | 12/2006 |
| WO | 2011018942 A1 | 2/2011 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |

(56) References Cited

FOREIGN PATENT DOCUMENTS

| | | |
|---|---|---|
| WO | 2013182969 A1 | 12/2013 |
| WO | 2015044620 A1 | 4/2015 |
| WO | 2016079505 A1 | 5/2016 |
| WO | 2017068029 A1 | 4/2017 |
| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019053923 A1 | 3/2019 |
| WO | 2019092357 A1 | 5/2019 |
| WO | 2019126539 A1 | 6/2019 |

OTHER PUBLICATIONS

PCT International Search Report and Written Opinion in PCT/US2022/042414 dated Dec. 22, 2022, 9 pages.
PCT International Search Report and Written Opinion in PCT/US2022/042415 dated Dec. 22, 2022, 9 pages.

* cited by examiner

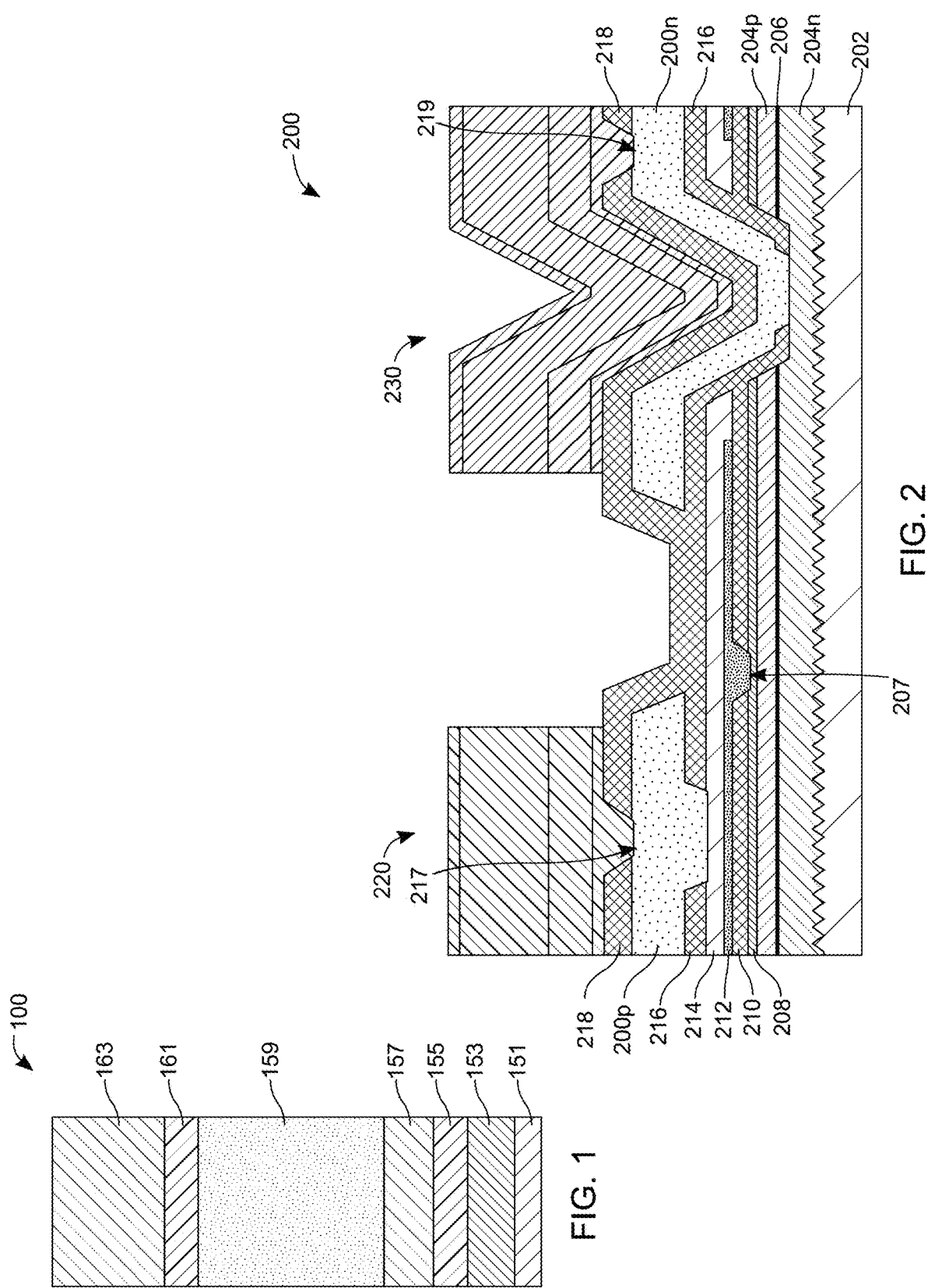

LIGHT EMITTING DIODE DEVICES WITH BONDING AND/OR OHMIC CONTACT-REFLECTIVE MATERIAL

CROSS-REFERENCE TO RELATED APPLICATION

This application claims priority to U.S. Provisional Application No. 63/240,588, filed Sep. 3, 2021, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to metal stacks and LED devices incorporating the same. The metal stacks are in contact with an N-type layer of the devices. The metal stacks comprise: an ohmic contact layer, a reflective layer, a first material barrier layer, a current carrying layer, and a second material barrier layer.

BACKGROUND

A light emitting diode (LED) is a semiconductor light source that emits visible light when current flows through it. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

High-intensity/brightness light emitting devices capable of operation across the visible spectrum include Group III-V semiconductors, particularly binary, ternary, and quaternary alloys of gallium, aluminum, indium, and nitrogen, also referred to as III-nitride materials. Typically, Ill-nitride light emitting devices are fabricated by epitaxially growing a stack of semiconductor layers of different compositions and dopant concentrations on a growth substrate such as a sapphire, silicon carbide, Ill-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Low work function metals are usually employed to form ohmic contact to n-GaN. Currently, the state-of-the-art ohmic contact materials for n-GaN are aluminum (Al) and titanium (Ti) metals, and low contact resistance to n-GaN is achieved, attributing to low work function of the Al and Ti materials. Due to its better optical reflectivity and electrical conductivity of Al as compared to Ti, Al is commonly used as n-GaN ohmic contact metal for high power LED devices. Al optical reflectivity is much lower than reflective materials such as silver (Ag) and gold (Au), especially at low optical angle of incident, and light long wavelength. Ag or Au, however, is not a good ohmic contact material to n-GaN, due to its high material work function, resulting extreme high contact resistance to n-GaN.

There is a need in the art to provide metal stacks that are suitable for providing ohmic contact and reflectivity to N-type layers.

SUMMARY

Provided herein are light emitting diode (LED) devices and methods of making and using the same.

In an aspect, a light emitting diode (LED) device comprises: semiconductor layers including an N-type layer, an active region, and a P-type layer; a metal stack of layers contacting the N-type layer, and a dielectric material which insulates the P-type layer and the active region from the N-bonding material. The metal stack of layers comprises: an ohmic contact layer electrically contacting the N-type layer and having a work function value that is less than or equal to a work function value of the N-type layer, a reflective layer electrically contacting the ohmic contact layer, a first material barrier layer electrically contacting the reflective layer, a current carrying layer electrically contacting the first material barrier layer, and a second material barrier layer electrically contacting the current carrying layer.

A further aspect is a method of manufacturing a metal stack of a light emitting diode (LED) device, the method comprising: depositing an ohmic contact layer electrically contacting an N-type layer of the LED device and having a work function value that is less than or equal to a work function value of the N-type layer; depositing a reflective layer electrically contacting the ohmic contact layer; depositing a first material barrier layer electrically contacting the reflective layer; depositing a current carrying layer electrically contacting the first material barrier layer; and depositing a second material barrier layer electrically contacting the current carrying layer.

In another aspect, a light emitting diode (LED) device comprises: semiconductor layers including an N-type layer, an active region, and a P-type layer; an N-bonding material electrically contacting the N-type layer; a P-bonding material electrically contacting the P-type layer and being isolated from the N-bonding material; and a first dielectric material which insulates the P-type layer and the active region from the N-bonding material. The N-bonding material being multilayered and comprising: an ohmic contact layer electrically contacting the N-type layer and having a work function value that is less than or equal to a work function value of the N-type layer, a reflective layer electrically contacting the ohmic contact layer, a first material barrier layer electrically contacting the reflective layer, a current carrying layer electrically contacting the first material barrier layer, and a second material barrier layer electrically contacting the current carrying layer. In one or more embodiments, the LED device is in the form of a chip scale package. In one or more embodiments, the LED device is in the form of a micro-LED monolithic array.

A further aspect is a method of manufacturing a light emitting diode (LED) device, the method comprising: preparing a plurality of semiconductor layers including an N-type layer, an active region, and a P-type layer; exposing the N-type layer; preparing a bonding material contacting the N-type layer; and depositing a dielectric material which insulates the P-type layer and the active region from the N-bonding material. The bonding material is formed by: depositing an ohmic contact layer electrically contacting the N-type layer and having a work function value that is less than or equal to a work function value of the N-type layer; depositing a reflective layer electrically contacting the ohmic contact layer; depositing a first N-bonding material barrier layer electrically contacting the reflective layer; depositing a current carrying layer electrically contacting the first material barrier layer; and depositing a second N-bonding material barrier layer electrically contacting the current carrying layer.

In an aspect, a light emitting diode (LED) device comprises: a plurality of mesas, each of the mesas comprising semiconductor layers, the semiconductor layers including an N-type layer, an active region, and a P-type layer, and each mesa having a top surface and at least one mesa sidewall; a plurality of trenches between the mesas defined by respective mesa sidewalls and each having a bottom surface, each of the trenches containing an N-ohmic contact-reflective material electrically contacting the N-type layer of each of the mesas; an N-electrode metal contained by the N-ohmic contact-reflective material, a dielectric material which insulates the P-type layer and the active region from the N-ohmic contact-reflective material; and a P-electrode metal in electrical contact with the P-type layer of each of the mesas. The N-ohmic contact-reflective material is multilayered and comprises: an ohmic contact layer electrically contacting the N-type layer and having a work function value that is less than or equal to a work function value of the N-type layer, a reflective layer electrically contacting the ohmic contact layer, a first material barrier layer electrically contacting the reflective layer, a current carrying layer electrically contacting the first material barrier layer, and a second material barrier layer electrically contacting the current carrying layer.

A further aspect is a method of manufacturing a light emitting diode (LED) device, the method comprising: preparing a plurality of mesas and trenches, each of the mesas comprising semiconductor layers, the semiconductor layers including an N-type layer, an active region, and a P-type layer, and each mesa having a top surface and at least one mesa sidewall, and the trenches defined by respective mesa sidewalls and each having a bottom surface; exposing the N-type layer; preparing an N-ohmic contact-reflective material electrically contacting the N-type layer of each of the mesas; depositing and patterning an N-electrode metal contained by the N-ohmic contact-reflective material and a P-electrode metal in electrical contact with the P-type layer of each of the mesas; and depositing and patterning a dielectric material which insulates the P-type layer and the active region from the N-ohmic contact-reflective material. The N-ohmic contact-reflective material being prepared by: depositing an ohmic contact layer electrically contacting the N-type layer and having a work function value that is less than or equal to a work function value of the N-type layer, depositing a reflective layer electrically contacting the ohmic contact layer, depositing a first material barrier layer electrically contacting the reflective layer, depositing a current carrying layer electrically contacting the first material barrier layer, and depositing a second material barrier layer electrically contacting the current carrying layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The figures herein are not to scale.

FIG. 1 a cross-sectional view of a metal stack of layers according to one or more embodiments;

FIG. 2 illustrates a cross-sectional view of an LED device, in particular, a chip scale package, according to one or more embodiments;

DETAILED DESCRIPTION

Figure 3:
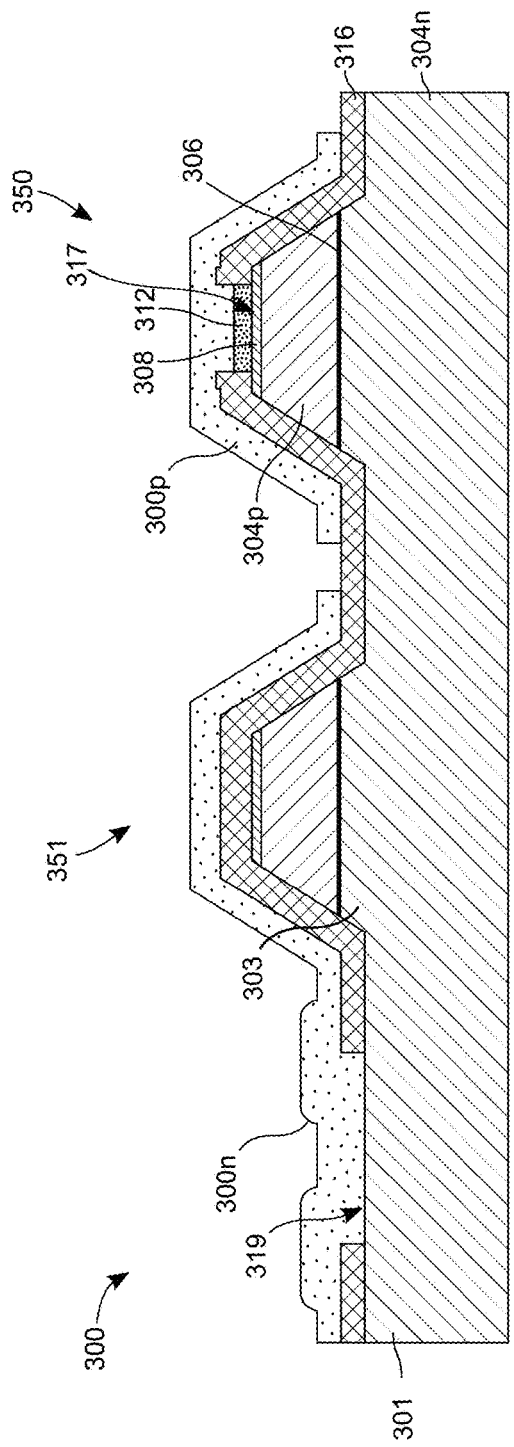
FIG. 3 illustrates a cross-sectional view of an LED device, in particular, a monolithic uLED array, according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices, including uLED devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Reference to a micro-LED (uLED or µLED) means a light emitting diode having one or more characteristic dimensions (e.g., height, width, depth, thickness, etc. dimensions) of less than 100 micrometers. In one or embodiments, one or more dimensions of height, width, depth, thickness have values in a range of 2 to 25 micrometers.

Advantages of the devices herein include an inventive metal stack, which by inserting a thin to very thin optically transparent ohmic contact layer, e.g., an n-GaN ohmic contact layer, in between an N-type layer, e.g., n-GaN, and a reflective layer (e.g., an Ag or Au mirror). very good ohmic contact with n-GaN is achieved, while achieving high reflectivity. Such devices are able to achieve low contact resistance (1% work function (Vf) reduction compared to Al baseline), and much higher optical extraction (1.5% light output power (LOP) gain as compared to an Al baseline).

In one or more embodiments, the metal stacks of layers herein are effective as an an ohmic contact-reflective material for providing low resistance and high reflectivity in LED devices.

In one or more embodiments, the metal stacks of layers herein are effective as a bonding material for adhering one or more LED devices to another structure, such as substrate, or a circuit board, or a backplane, or the like.

Figures 6, 7:
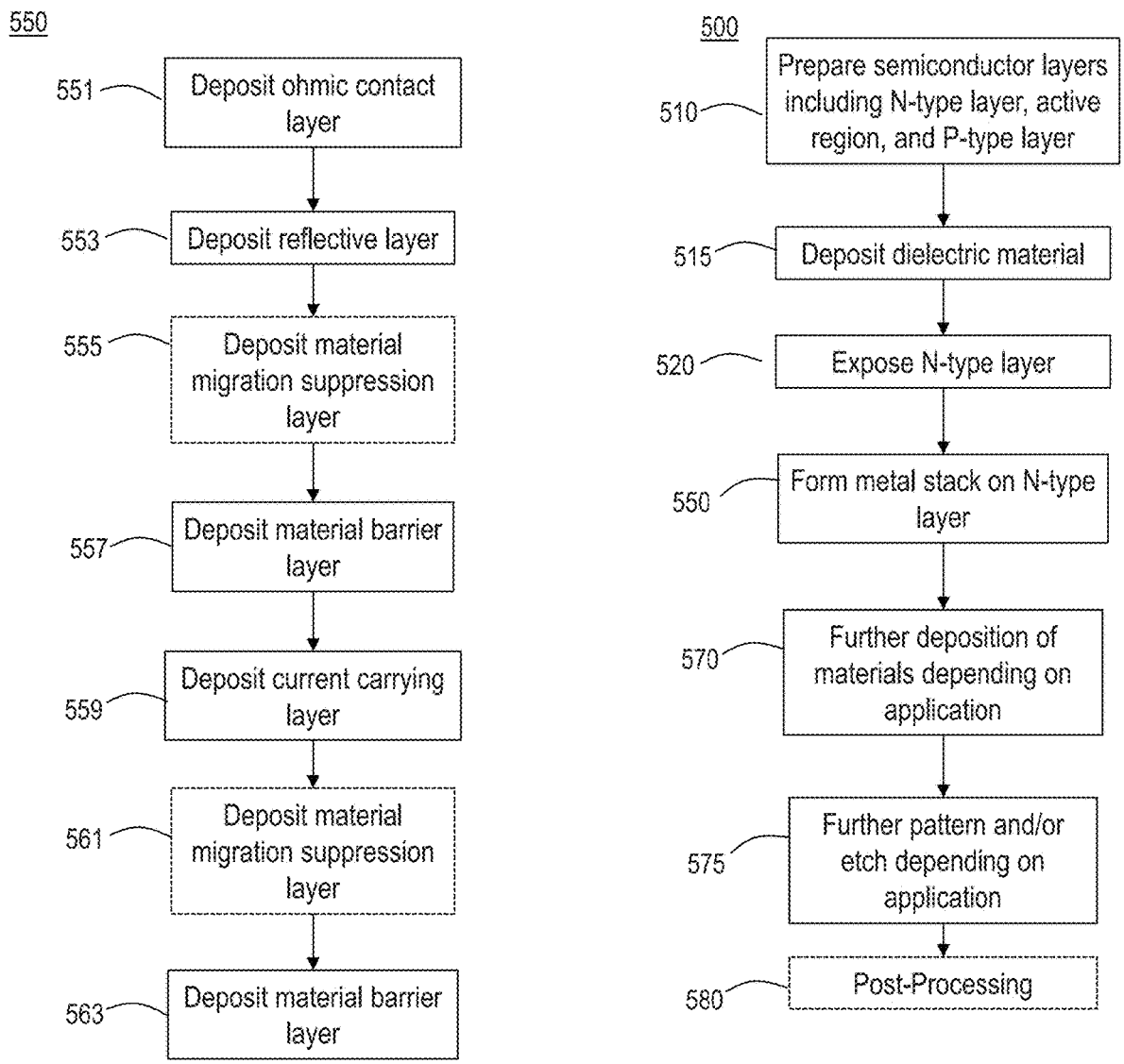
FIG. 6 provides an exemplary process flow diagram for manufacture of a metal stack according to one or more embodiments.
FIG. 7 provides an exemplary process flow diagram for manufacture of a LED device according to one or more embodiments.

Turning to the figures, FIG. 1 illustrates a cross-sectional view of a metal stack of layers according to one or more embodiments, and FIG. 6 provides an exemplary process flow diagram 550 for manufacture of a metal stack. Methods of depositing materials, layers, and thin films herein include but are not limited to: sputter deposition, evaporation deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Metal stack of layers 100 comprises an ohmic contact layer 151, which is a layer to be in electrical contact, in particular in one or more embodiments, in direct contact, with an N-layer of a light emitting diode (LED) device. At operation 551 of FIG. 6, the ohmic contact layer is deposited so that it is electrically contacting the N-type layer of a plurality of semiconductor layers. In one or more embodiments, the ohmic contact layer is in direct contact with the N-type layer. The ohmic contact layer 151 has a work function value that is less than or equal to a work function value of the N-type layer. For example, an N-type layer of n-GaN has a work function value of approximately 4.1 eV. Exemplary ohmic contact layers according to one or more embodiments comprise Al (Vf~4.06-4.26 eV), Ti (Vf~4.0-4.33), or AZO (Al-doped ZnO) (Vf of ~3.1-4.5). In one or more embodiments, the ohmic contact layer comprises a thickness in a range of greater than or equal to 5 Å to less than or equal to 200 Å, and all values and subranges therebetween. The ohmic contact layer is designed to be thick enough to form ohmic contact with the N-layer and offer sufficient adhesive force for a reflective layer 153 (e.g., Ag or Au), while not being too thick such that it does not degrade reflectivity of the reflective layer.

Figure 5:
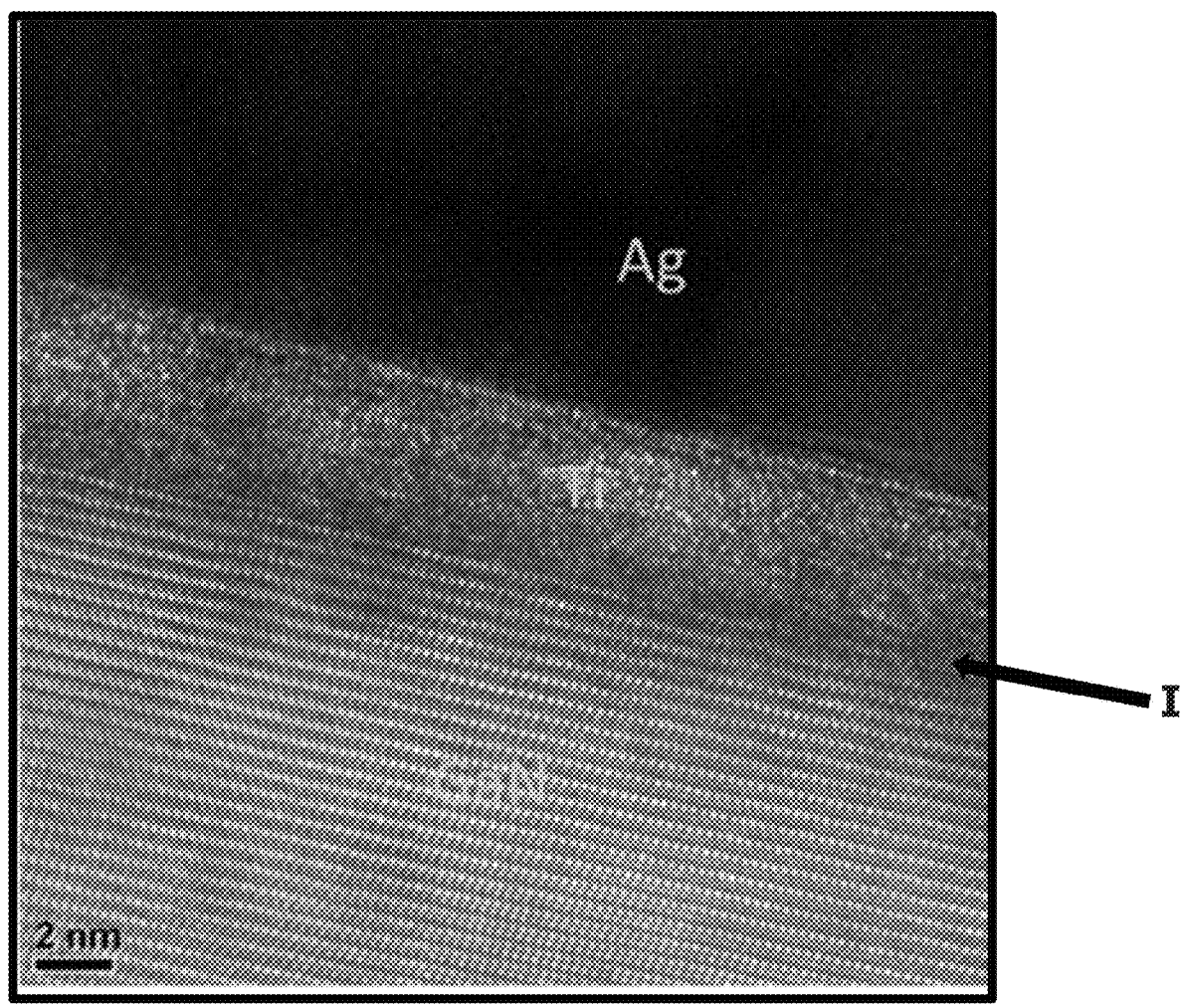
FIG. 5 is a transmission electron microscope (TEM) micrograph of an excerpt of an exemplary embodiment made according to methods herein.

Further, it is expected that the ohmic contact layer (e.g., Ti) will react with the N-layer (e.g., n-GaN) at mesa during downstream thermal cycle steps at an interface, which forms, e.g., TiNx at n-GaN/Ti interface, which further reduce contact resistance and improve the transparency. In FIG. 5, a transmission electron microscope (TEM) micrograph of an excerpt of an exemplary embodiment made according to methods herein shows a GaN layer on which a Ti ohmic contact layer is deposited and an Ag reflective layer is on the Ti layer. Reaction between the GaN and Ti at their interface is shown by arrow "I".

The metal stack of layers 100 also comprises the reflective layer 153 electrically contacting the ohmic contact layer 151. At operation 553 of FIG. 6, the reflective layer 153 is deposited in direct contact with the ohmic contact layer 151. In one or more embodiments, the reflective layer 153 comprises silver (Ag) or gold (Au). In one or more embodiments, the reflective layer comprises a thickness of greater than or equal to 1000 Å. In some embodiments, the ohmic contact layer is advantageously very thin relative to the reflective layer (e.g., greater than or equal to 5 Å to less than or equal to 200 Å). In one or more embodiments, the ohmic contact layer has a thickness of less than or equal to 20% a thickness of the reflective layer, including less than or equal to 10%, 5%, 1%, or 0.5%, and all values and subranges therebetween.

The metal stack of layers 100 also comprises a first material barrier layer 157 electrically contacting the reflective layer 153. At operation 557 of FIG. 6, the first material barrier layer 157 is deposited in electrical contact with the reflective layer 153. In one or more embodiments, the first material barrier layer 157 is in direct contact with the reflective layer 153. In other embodiments, when a first material migration suppression layer 155 is deposited in accordance with optional operation 555 of FIG. 6, the first material barrier layer 157 is in indirect contact with the reflective layer 153. The first material barrier layer 157 impedes and/or prevents metals of the reflective layer 153 from forming an intermetallic species or alloy with metals of a current carrying layer 159. In one or more embodiments, the first material barrier layer 157 comprises: titanium (Ti), chromium (Cr), platinum (Pt), cobalt (Co), palladium (Pd), tungsten (W), or combinations thereof. In one or more embodiments, the first material barrier layer 157 comprises a thickness of greater than or equal to 1000 Å.

The metal stack of layers 100 also optionally comprises the first material migration suppression layer 155. In one or more embodiments, the first material migration suppression layer 155 is in direct contact with the reflective layer 153 on one surface and the first material barrier layer 157 on the other surface. The first material migration suppression layer 155 can suppress thermal and electrical migration of metals of the reflective layer 153. In one or more embodiments, the first material migration suppression layer 155 comprises nickel (Ni) or palladium (Pd). In one or more embodiments, the first material migration suppression layer 155 comprises a thickness of greater than or equal to 50 Å to less than or equal to 1000 Å, and all values and subranges therebetween.

The metal stack of layers 100 comprises the current carrying layer 159 electrically contacting the first material barrier layer 157. At operation 559 of FIG. 6, the current carrying layer 159 is deposited on the first material barrier layer 157. In one or more embodiments, the current carrying layer 159 is in direct contact with the first material barrier layer 157. In one or more embodiments, the current carrying layer 159 comprises copper (Cu), gold (Au), aluminum (Al), or combinations thereof. In one or more embodiments, the current carrying layer comprises a thickness of greater than or equal to 5000 Å.

The metal stack of layers 100 comprises a second material barrier layer 163 electrically contacting the current carrying layer 159 and capping the metal stack of layers 100. At operation 563 of FIG. 6, the second material barrier layer 163 is deposited in electrical contact with the current carrying layer 159. In one or more embodiments, the second material barrier layer 163 is in direct contact with the current carrying layer 159. In other embodiments, when a second material migration suppression layer 161 is deposited in accordance with optional operation 561 of FIG. 6, the second material barrier layer 163 is in indirect contact with the current carrying layer 159. The second material barrier layer 163 is a protective layer, which impedes and/or prevents attack of the metal stack by downstream processing steps, i.e. dry etch, wet etch, cleaning etc. In one or more embodiments, the second material barrier layer 163 comprises: titanium (Ti), chromium (Cr), platinum (Pt), cobalt (Co), palladium (Pd), tungsten (W), or combinations thereof. In one or more embodiments, the second material barrier layer 163 comprises a thickness of greater than or equal to 1000 Å.

The metal stack of layers 100 also optionally comprises the second material migration suppression layer 161. In one or more embodiments, the second material migration suppression layer 161 is in direct contact with current carrying layer 159 on one surface and the second material barrier layer 163 on the other surface. The second material migration suppression layer 161 can suppress thermal and electrical migration of metals of the current carrying layer 159. In one or more embodiments, the second material migration suppression layer 161 comprises nickel (Ni) or palladium (Pd). In one or more embodiments, the second material migration suppression layer 161 comprises a thickness of greater than or equal to 50 Å to less than or equal to 1000 Å, and all values and subranges therebetween. In one or more embodiments, the second material barrier layer 163 alone or in combination with the second material migration suppression layer 161 is effective as a capping layer for the metal stack 100 as a whole, to protect against degradation during downstream process steps.

FIG. 7 provides an exemplary process flow diagram 500 for manufacture of a LED device according to one or more general embodiments. At operation 510, semiconductor layers including N-type layer, active region, and P-type layer are formed according to methods known in the art. In one or more embodiments, the semiconductor layers are formed by epitaxial (EPI) growth. The semiconductor layers according to one or more embodiments comprise epitaxial layers, III-nitride layers, or epitaxial III-nitride layers. In one or more embodiments, the semiconductor layers comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like.

In one or more embodiments, semiconductor layers are grown on a substrate, which may remain or may be removed at later points during manufacturing. The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the epitaxial layer(s). Thus, in some embodiments, the substrate is not patterned and can be considered to be flat or substantially flat. In other embodiments, the substrate is patterned, e.g. patterned sapphire substrate (PSS).

In one or more embodiments, the semiconductor layers comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In one or more embodiments, the semiconductor layers have a combined thickness in a range of from about 2 µm to about 10 µm, and all values and subranges therebetween.

In one or more embodiments, the active layer is formed between the N-type layer and the P-type layer. The active layer may comprise any appropriate materials known to one of skill in the art. In one or more embodiments, the active layer is comprised of a III-nitride material multiple quantum wells (MQW), and a III-nitride electron blocking layer.

At operation 515, dielectric material is deposited. Suitable dielectric materials include, but are not limited to, silicon oxide (SiO), silicon nitride (SiN), silicon carbide (SiC), aluminum oxide (AlOx), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

At operation 520, etching or patterning is conducted to expose at least the N-type layer. According to one or more embodiments, conventional masking, wet etching and/or dry etching processes can be used.

At operation 550, a metal stack, suitable as a bonding layer and/or as an ohmic contact-reflective layer is deposited in contact with at least the N-type layer. Operation 550 of forming the metal stack is detailed with respect to FIG. 6. At operations 570 and 575, any further deposition of materials and/or further etching is conducted to arrive at a desired device configuration.

At operation 580, any further post-processing is performed. In one or more embodiments, further processing including formation of a passivation layer around a portion or the entirety of a LED or a uLED or the device as a whole. In one or more embodiments, the processed structure retains a substrate, is singulated, and is further processed. In one or more embodiments, the processed structure is flipped and affixed to a support, for example, a tape support, and the substrate is removed. Removal of the substrate is in accordance with methods known in the art including substrate laser liftoff. Upon removal of the substrate, singulated LEDs or uLEDs are created.

Further processing can include deposition of a down-converter material, e.g. layers of a phosphor material.

FIG. 2 illustrates a cross-sectional view of an LED device according to one or more embodiments. In the embodiment of FIG. 2, a chip scale package 200 comprises semiconductor layers including an N-type layer 204n, an active region 206, and a P-type layer 204p. The semiconductor layers reside on a substrate 202.

An N-bonding material 200n electrically contacts the N-type layer 204n. The N-bonding material 200n is multi-layered, analogous to 100 exemplified in FIG. 1, and comprises an ohmic contact layer 151 electrically contacting the N-type layer and having a work function value that is less than or equal to a work function value of the N-type layer; a reflective layer 153 electrically contacting the ohmic contact layer 151; a material barrier layer 157, e.g., for FIG. 2, a first N-bonding material barrier layer, electrically contacting the reflective layer; a current carrying layer 159 electrically contacting the material barrier layer 157 (e.g., the first N-bonding material barrier layer); and another material barrier layer 161, e.g., for FIG. 2, a second N-bonding material barrier layer electrically contacting the current carrying layer 159. In this embodiment, the ohmic contact layer 151 is in direct contact with the N-type layer 204n.

A P-bonding material 200p electrically contacts the P-type layer 204p by way of a P-metal layer 212, a guardsheet 214, and a current spreading layer 208. The P-bonding material 200p is isolated from the N-bonding material 200n by second dielectric layer 216 and third dielectric layer 218. In one or more embodiments, the P-bonding material 200p is the same as the N-bonding material 200n.

A first dielectric material 210 insulates the P-type layer 204p and the active region 206 from the N-bonding material 200n. The first dielectric material 210 of FIG. 2 also isolates the current spreading layer 208 on the P-type layer 204p from the N-type layer 204n.

The P-metal layer 212 resides on the first dielectric material 210 and in a via opening 207 for direct contact with the current spreading layer 208 and for electrical contact with the P-type layer. The guardsheet 214 is on the p-metal layer 212.

An N-pad 230 contacts the N-bonding layer 200n through an n-opening 219 in the third dielectric layer 218. The N-pad 230 may be multi-layered, comprising one or more of: a seed layer and various n-electrode metals.

A P-pad 220 contacts the P-bonding layer 200p through an p-opening 217 in the third dielectric layer 218. The P-pad 220 may be multi-layered, comprising one or more of: a seed layer and various p-electrode metals.

FIG. 3 illustrates a cross-sectional view of an LED device according to one or more embodiments. In the embodiment of FIG. 3, a monolithic die of micro-light emitting diodes (uLEDs) 300 comprises a plurality of mesas 350, 351 in the form of an array. Mesas 350 and 351 comprises semiconductor layers including an N-type layer 304n, an active region 306, and a P-type layer 304p. In this embodiment, the ohmic contact layer 151 is in direct contact with the N-type layer 304n.

A current spreading layer 308 is on the P-type layer 304p. There is not a substrate in this embodiment. Rather, a first portion 301 of the N-type layer 304n forms a monolithic body, and a second portion 303 of the N-type layer in combination with the active region, and the P-type layer form a plurality of mesas 350, 351 integral to the monolithic body. A P-metal layer 312 on the current spreading layer 308 on mesa 350 yields an active pixel and light upon application of current, and in conjunction with an anode and a cathode. A P-metal layer is not included on mesa 351, which yields an inactive area, namely no light, upon application of current. The mesas 350, 351 are typically formed by etching a structure of semiconductor layers.

An N-bonding material 300n electrically contacts the first portion 301 of the N-type layer 304n through an N-opening 319 in a dielectric material 316. The N-bonding material is multi-layered, analogous to FIG. 1, and comprises an ohmic contact layer 151 electrically contacting the N-type layer and having a work function value that is less than or equal to a work function value of the N-type layer; a reflective layer 153 electrically contacting the ohmic contact layer 151; a material barrier layer 157, e.g., for FIG. 3, a first N-bonding material barrier layer, electrically contacting the reflective layer; a current carrying layer 159 electrically contacting the material barrier layer 157 (e.g., the first N-bonding material barrier layer); and another material barrier layer 161, e.g., for FIG. 2, a second N-bonding material barrier layer electrically contacting the current carrying layer 159.

A P-bonding material 300p electrically contacts the P-type layer 304p through a p-opening 317 in the dielectric material 316 by way of a P-metal layer 312 and the current spreading layer 308. The P-bonding material 300p is isolated from the N-bonding material 300n by physically being separate. In one or more embodiments, the P-bonding material 300p is the same as the N-bonding material 300n.

The dielectric layer material 316 insulates the P-type layer and the active region from the N-bonding material. The dielectric material 316 of FIG. 3 also isolates the current spreading layer 308 on the P-type layer 304p from the N-type layer 304n.

Figure 4:
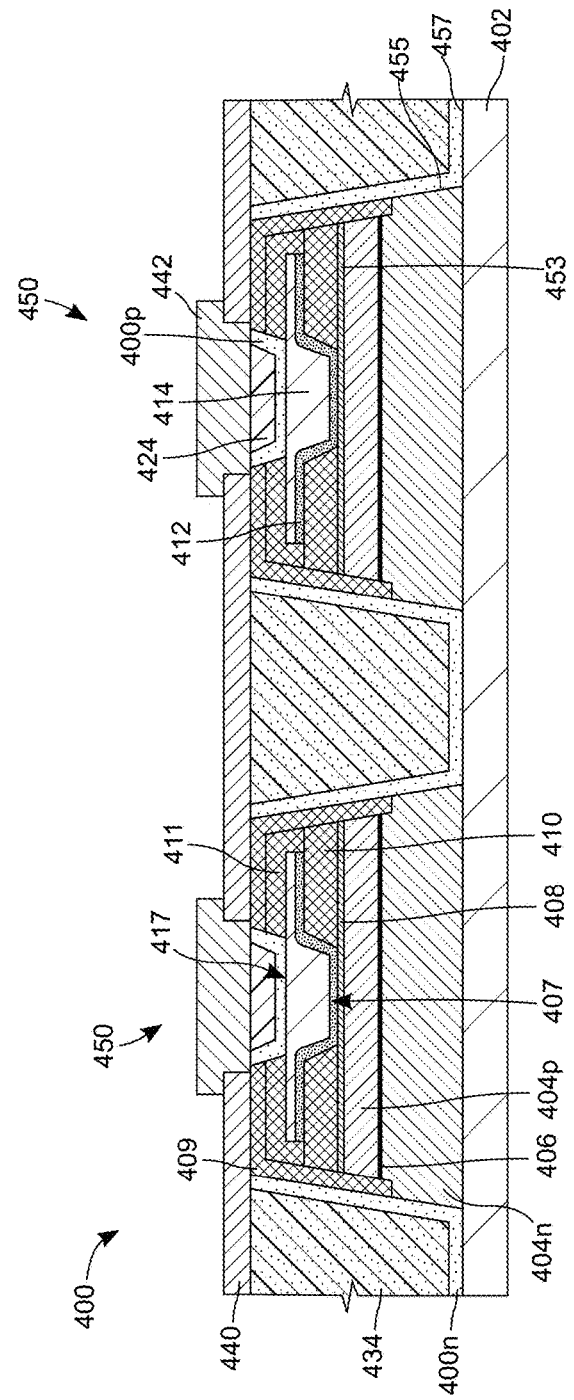
FIG. 4 illustrates a cross-sectional view of an LED device, in particular, an array of uLEDs on a substrate, according to one or more embodiments.

FIG. 4 illustrates a cross-sectional view of an LED device according to one or more embodiments. In the embodiment of FIG. 4, an array of micro-light emitting diodes (uLEDs) 400 comprises a plurality of mesas 450. Mesas 450 each comprise semiconductor layers including an N-type layer 404n, an active region 406, and a P-type layer 404p. The mesas 450 are typically formed by etching or patterning a structure of semiconductor layers on a substrate such that mesas of the semiconductor layers remain and trenches each having a bottom defined by exposed surfaces of the substrate between the mesas are created. In some embodiments, after further construction of the device including filling the trenches with layers and/or materials, the substrate may be removed.

With respect to etching, according to one or more embodiments, highly anisotropic etch methods are used to achieve angles ranging from vertical (90 degrees) to 80 degrees to even smaller values, and all values therebetween. In one or more embodiments, depth of the mesa/trench etch will typically not exceed 5 micrometers. In one or more embodiments, an anisotropic etch is used to form trenches. In one or more embodiments, the width of the mesa is less than 100 micrometers. In one or more embodiments, the height of the mesa is less than or equal to the width of the mesa.

Each mesa has a top surface 453 (usually the top of the P-type layer 404p) and at least one mesa sidewall 455. In one or more embodiments, the semiconductor layers are on a substrate 402. A plurality of trenches between the mesas 450 defined by respective mesa sidewalls 455 and each having a bottom surface 457, each of the trenches containing an N-ohmic contact-reflective material 400n electrically contacting the N-type layer 400n of each of the mesas 450. The N-ohmic contact-reflective material 400n is multi-layered, as exemplified in FIG. 1, and comprises an ohmic contact layer 151 electrically contacting the N-type layer and having a work function value that is less than or equal to a work function value of the N-type layer; a reflective layer 153 electrically contacting the ohmic contact layer 151; a material barrier layer 157 electrically contacting the reflective layer; a current carrying layer 159 electrically contacting the material barrier layer 157; and another material barrier layer 161 electrically contacting the current carrying layer 159. In this embodiment, the ohmic contact layer 151 is in direct contact with the N-type layer 404n.

On top surfaces 453 of each mesa 450, a current spreading layer 408 is on the P-type layer 404p. Dielectric materials 409, 410, and 411 provide electrical isolations. For example, first dielectric material 409 insulates the P-type layer 404p and the active region 406 from the N-ohmic contact-reflective material 400n. The first dielectric material 409 also isolates the current spreading layer 408 on the P-type layer 404p from the N-type layer 404n.

A P-ohmic contact-reflective material 400p electrically contacts the P-type layer 404p through a via 407 in second dielectric material 410 by way of a P-metal layer 412 and the current spreading layer 408. The P-ohmic contact-reflective material 400p is isolated from the N-ohmic contact-reflective material 400n by the first dielectric material 409 and the third dielectric material 411. In one or more embodiments, the P-ohmic contact-reflective material 400p is the same as the N-ohmic contact-reflective material 400n.

The device further comprises electrode metals: N-electrode metal 434 contained by the N-ohmic contact-reflective material 400n, and P-electrode metal 424 contained by the P-ohmic contact-reflective material 400p.

In one or more embodiments, a passivation layer 440 is provided on the first dielectric material 409, and the N-electrode metal 434. Underbump metallization 442 is optionally on each P-electrode metal 424, which may be in the form of a plug.

Display Devices

Some display devices comprise single or singulated LEDs or pixels, which include the bonding and/or ohmic contact-reflective material disclosed herein.

Other display devices comprise arrays and groups of LEDs or pixels, which include the bonding and/or ohmic contact-reflective material disclosed herein.

Figure 8:
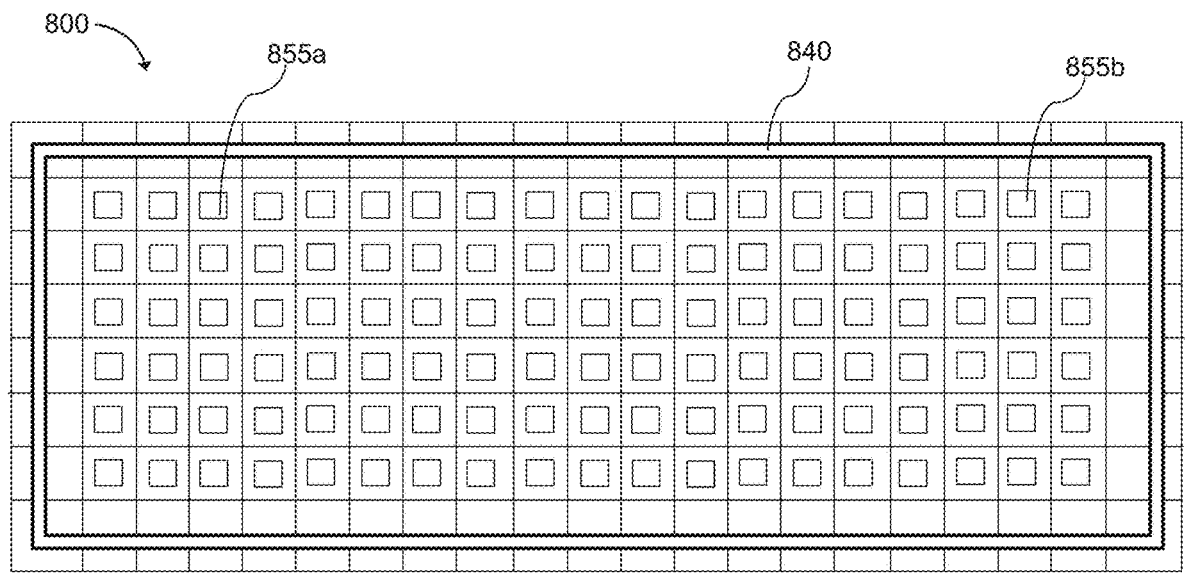
FIG. 8 schematically illustrates a top view of an exemplary display device according to one or more embodiments.

FIG. 8 shows a top plan view of an LED monolithic array 800 comprising a plurality of pixels arranged in a grid of 6×19. Pixels 855a and 855b are examples. In this embodiment, a common cathode 840 is connected to the pixels. Anodes, not shown, present on the underside are included with each pixel. In one or more embodiments, the array comprises an arrangement of 2×2 mesas, 4×4 mesas, 20×20 mesas, 50×50 mesas, 100×100 mesas, or n1×n2 mesas, where each of n1 and n2 is a number in a range of from 2 to 1000, and n1 and n2 can be equal or not equal.

In one or more embodiments, arrays of micro-LEDs (μLEDs or uLEDs) are used. Micro-LEDs can support high density pixels having a lateral dimension less than 100 μm by 100 μm. In some embodiments, micro-LEDs with dimensions of about 50 μm in diameter or width and smaller can be used. Such micro-LEDs can be used for the manufacture of color displays by aligning in close proximity micro-LEDs comprising red, blue and green wavelengths.

In some embodiments, the light emitting arrays include small numbers of micro-LEDs positioned on substrates that are centimeter scale area or greater. In some embodiments, the light emitting arrays include micro-LED pixel arrays with hundreds, thousands, or millions of light emitting LEDs positioned together on centimeter scale area substrates or smaller. In some embodiments, micro-LEDs can include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective pixel size.

In some embodiments, light emitting pixels and circuitry supporting light emitting arrays are packaged and optionally include a submount or printed circuit board connected for powering and controlling light production by semiconductor LEDs. In certain embodiments, a printed circuit board supporting light emitting array includes electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the light emitting array and a power supply, and also provide heat sink functionality.

In some embodiments, LED light emitting arrays include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two-or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Applications

Figure 9:
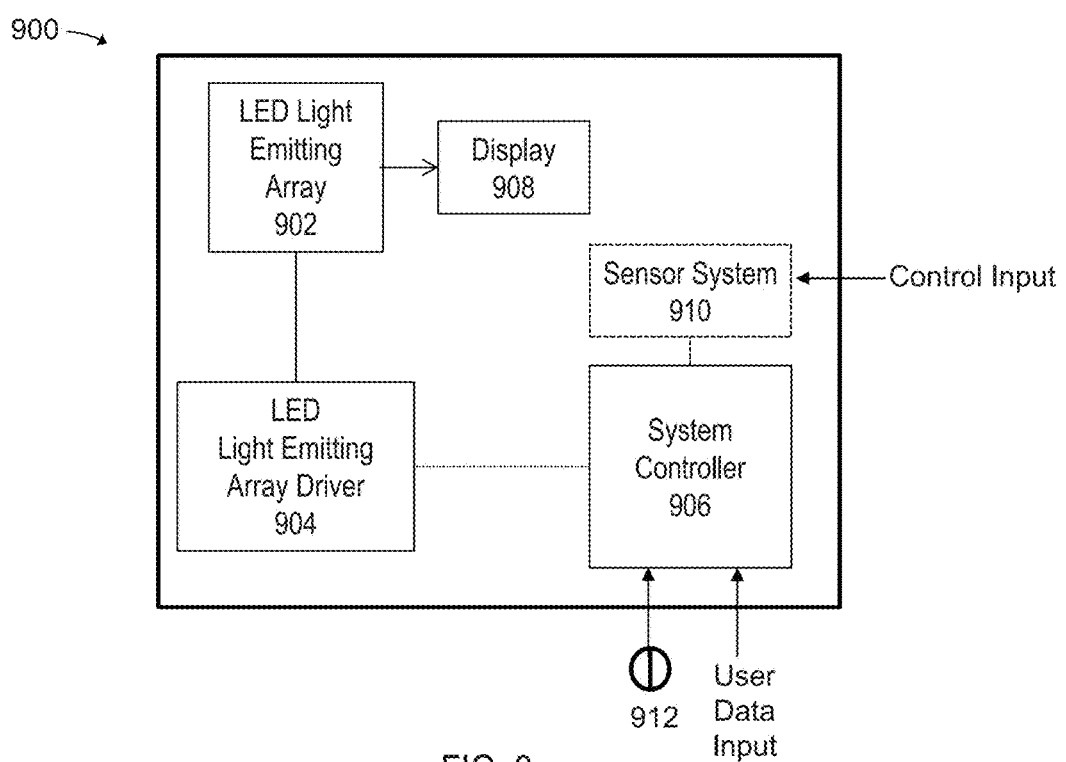
FIG. 9 schematically illustrates an exemplary display system comprising LED devices according to embodiments herein.

FIG. 9 schematically illustrates an exemplary display system 900 utilizing LEDs disclosed herein. The display system 900 comprises an LED light emitting array 902 and display 908 in electrical communication with an LED driver 904. The display system 900 also comprises a system controller 906, such as a microprocessor. The controller 906 is coupled to the LED driver 904. The controller 906 may also be coupled to the display 908 and to optional sensor(s) 910, and be powered by power source 912. In one or more embodiments, user data input is provide to system controller 906.

In one or more embodiments, the system is a camera flash system utilizing uLEDs. In such an embodiment, the LED light emitting array 902 is an illumination array and lens system and the display 908 comprises a camera, wherein the LEDs of 902 and the camera of 908 may be controlled by the controller 906 to match their fields of view.

Optionally sensors 910 with control input may include, for example, positional sensors (e.g., a gyroscope and/or accelerometer) and/or other sensors that may be used to determine the position, speed, and orientation of system. The signals from the sensors 910 may be supplied to the controller 906 to be used to determine the appropriate course of action of the controller 906 (e.g., which LEDs are currently illuminating a target and which LEDs will be illuminating the target a predetermined amount of time later).

In operation, illumination from some or all of the pixels of the LED array in 902 may be adjusted—deactivated, operated at full intensity, or operated at an intermediate intensity. As noted above, beam focus or steering of light emitted by the LED array in 902 can be performed electronically by activating one or more subsets of the pixels, to permit dynamic adjustment of the beam shape without moving optics or changing the focus of the lens in the lighting apparatus.

LED array systems such as described herein may support various other beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

Other applications of LED devices herein include an augmented reality/virtual reality (AR/VR) systems, which may utilize uLEDs disclosed herein. One or more AR/VR systems include: augmented (AR) or virtual reality (VR) headsets, glasses, or projectors. Such AR/VR systems includes an LED light emitting array, an LED driver (or light emitting array controller), a system controller, an AR or VR display, a sensor system 810. Control input may be provided to the sensor system, while power and user data input is provided to the system controller. As will be understood, in some embodiments modules included in the AR/VR system can be compactly arranged in a single structure, or one or more elements can be separately mounted and connected via wireless or wired communication. For example, the light emitting array, AR or VR display, and sensor system can be mounted on a headset or glasses, with the LED driver and/or system controller separately mounted.

In one embodiment, the light emitting array can be used to project light in graphical or object patterns that can support AR/VR systems. In some embodiments, separate light emitting arrays can be used to provide display images, with AR features being provided by a distinct and separate micro-LED array. In some embodiments, a selected group of pixels can be used for displaying content to the user while tracking pixels can be used for providing tracking light used in eye tracking. Content display pixels are designed to emit visible light, with at least some portion of the visible band (approximately 400 nm to 750 nm). In contrast, tracking pixels can emit light in visible band or in the IR band (approximately 750 nm to 2,200 nm), or some combination thereof. As an alternative example, the tracking pixels could operate in the 800 to 1000 nanometer range. In some embodiments, the tracking pixels can emit tracking light during a time period that content pixels are turned off and are not displaying content to the user.

The AR/VR system can incorporate a wide range of optics in the LED light emitting array and/or AR/VR display, for example to couple light emitted by the LED light emitting array into AR/VR display as discussed above. For AR/VR applications, these optics may comprise nanofins and be designed to polarize the light they transmit.

In one embodiment, the light emitting array controller can be used to provide power and real time control for the light emitting array. For example, the light emitting array controller can be able to implement pixel or group pixel level control of amplitude and duty cycle. In some embodiments, the light emitting array controller further includes a frame buffer for holding generated or processed images that can be supplied to the light emitting array. Other supported modules can include digital control interfaces such as Inter-Integrated Circuit (I2C) serial bus, Serial Peripheral Interface (SPI), USB-C, HDMI, Display Port, or other suitable image or control modules that are configured to transmit needed image data, control data or instructions.

In operation, pixels in the images can be used to define response of corresponding light emitting array, with intensity and spatial modulation of LED pixels being based on the image(s). To reduce data rate issues, groups of pixels (e.g. 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. Pulse width modulation can be used to control each pixel to emit light in a pattern and with an intensity at least partially dependent on the image.

In some embodiments, the sensor system can include external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position. As another example, based on the one or more measurement signals from one or more gyroscope or position sensors that measure translation or rotational movement, an estimated position of AR/VR system relative to an initial position can be determined.

In some embodiments, the system controller uses data from the sensor system to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow.

Based on changes in position, orientation, or movement of the AR/VR system, the system controller can send images or instructions the light emitting array controller. Changes or modification the images or instructions can also be made by user data input, or automated data input as needed. User data input can include but is not limited to that provided by audio instructions, haptic feedback, eye or pupil positioning, or connected keyboard, mouse, or game controller.

EMBODIMENTS

Various embodiments are listed below. It will be understood that the embodiments listed below may be combined with all aspects and other embodiments in accordance with the scope of the invention.

Embodiment (a). A light emitting diode (LED) device comprising: semiconductor layers including an N-type layer, an active region, and a P-type layer; an N-bonding material electrically contacting the N-type layer, the N-bonding material being multi-layered and comprising: an ohmic contact layer electrically contacting the N-type layer and having a work function value that is less than or equal to a work function value of the N-type layer; a reflective layer electrically contacting the ohmic contact layer; a first N-bonding material barrier layer electrically contacting the reflective layer; a current carrying layer electrically contacting the first N-bonding material barrier layer; and a second N-bonding material barrier layer electrically contacting the current carrying layer; a P-bonding material electrically contacting the P-type layer and being isolated from the N-bonding material; and a first dielectric material which insulates the P-type layer and the active region from the N-bonding material.

Embodiment (b). The LED device of embodiment (a), wherein the ohmic contact layer is in direct contact with the N-type layer.

Embodiment (c). The LED device of any of embodiments (a) to (b), wherein a thickness of the ohmic contact layer is less than or equal to 20% of a thickness of the reflective layer.

Embodiment (d). The LED device of any of embodiments (a) to (c), wherein: the ohmic contact layer comprises: aluminum (Al), titanium (Ti), or aluminum-doped zinc oxide (AZO), the reflective layer comprises silver (Ag) or gold (Au); the first and second N-bonding material barrier layers each independently comprise: titanium (Ti), chromium (Cr), platinum (Pt), cobalt (Co), palladium (Pd), or tungsten (W), and the current carrying layer comprises: copper (Cu), gold (Au), or aluminum (Al).

Embodiment (e). The LED device of any of embodiments (a) to (d), wherein the N-type layer comprises n-GaN.

Embodiment (f). The LED device of any of embodiments (a) to (e), wherein: the ohmic contact layer comprises a thickness in a range of greater than or equal to 5 Å to less than or equal to 200 Å, the reflective layer comprises a thickness of greater than or equal to 1000 Å, the first and second N-bonding material barrier layers each independently comprise a thickness of greater than or equal to 1000 Å, and the current carrying layer comprises a thickness of greater than or equal to 5000 Å.

Embodiment (g). The LED device of any of embodiments (a) to (f), wherein the N-bonding material further comprises a first N-bonding material migration suppression layer electrically contacting the reflective layer and the first material barrier layer; and a second N-bonding material migration suppression layer electrically contacting the current carrying layer and the second material barrier layer.

Embodiment (h). The LED device of embodiment (g), wherein the first and second N-bonding material migration suppression layers each independently comprise nickel (Ni) or palladium (Pd), and/or independently comprise a thickness in a range of greater than or equal to 50 Å to less than or equal to 1000 Å.

Embodiment (i). The LED device of any of embodiments (a) to (h), wherein the P-bonding material is the same as the N-bonding material.

Embodiment (j). The LED device of any of embodiments (a) to (i), wherein the semiconductor layers are on a substrate and the N-bonding material directly contacts the N-type layer, and the device further comprises an N-pad electrically contacting the N-bonding layer and a P-pad electrically contacting the P-bonding layer, and a second dielectric material which insulates the N-bonding material from the P-bonding material.

Embodiment (k). The LED device of embodiment (j), which is in a form of a chip scale package.

Embodiment (l). The LED device of any of embodiments (a) to (i), which is in a form of a monolithic array, wherein a first portion of the N-type layer forms a monolithic body, and a second portion of the N-type layer in combination with the active region and the P-type layer form a plurality of mesas integral to the monolithic body, the N-bonding material directly contacts the first portion of the N-type layer, and each of the mesas has at least one characteristic dimension of less than 100 micrometers, the character dimension being selected from the group consisting of: height, width, and depth.

Embodiment (m). A method of manufacturing a light emitting diode (LED) device comprising: preparing a plurality of semiconductor layers including an N-type layer, an active region, and a P-type layer; exposing the N-type layer; preparing an N-bonding material contacting the N-type layer by: depositing an ohmic contact layer electrically contacting the N-type layer and having a work function value that is less than or equal to a work function value of the N-type layer; depositing a reflective layer electrically contacting the ohmic contact layer; depositing a first N-bonding material barrier layer electrically contacting the reflective layer; depositing a current carrying layer electrically contacting the first material barrier layer; and depositing a second N-bonding material barrier layer electrically contacting the current carrying layer; and depositing a dielectric material which insulates the P-type layer and the active region from the N-bonding material.

Embodiment (n). The method of embodiment (m) comprising depositing the ohmic contact layer directly on the N-type layer.

Embodiment (o). The method of any of embodiments (m) to (p), wherein the N-type layer comprises n-GaN, and the ohmic contact layer comprises: aluminum (Al), titanium (Ti), or aluminum-doped zinc oxide (AZO); the reflective layer comprises silver (Ag) or gold (Au); the first and second material barrier layers each independently comprise: titanium (Ti), chromium (Cr), platinum (Pt), cobalt (Co), palladium (Pd), or tungsten (W); and the current carrying layer comprises: copper (Cu), gold (Au), or aluminum (Al).

Embodiment (p). The method of any of embodiments (m) to (o), wherein: the ohmic contact layer comprises a thickness in a range of greater than or equal to 5 Å to less than or equal to 200 Å, the reflective layer comprises a thickness of greater than or equal to 1000 Å, the first and second material barrier layers each independently comprise a thickness of greater than or equal to 1000 Å, and the current carrying layer comprises a thickness of greater than or equal to 5000 Å.

Embodiment (q). The method of any of embodiments (m) to (p) further comprising: depositing a first material migration suppression layer electrically contacting the reflective layer and the first material barrier layer; and/or a second material migration suppression layer electrically contacting the current carrying layer and the second material barrier layer.

Embodiment (r). The method of any of embodiment (q), wherein the first and second material migration suppression layers each independently comprise nickel (Ni) or palladium (Pd), and/or independently comprise a thickness in a range of greater than or equal to 50 Å to less than or equal to 1000 Å.

Embodiment (s). The method of any of embodiments (m) to (r), wherein a P-bonding material is also prepared contacting the P-type layer by depositing the ohmic contact layer electrically contacting the P-type layer, depositing the reflective layer electrically contacting the ohmic contact layer, depositing the first N-bonding material barrier layer electrically contacting the reflective layer, depositing the current carrying layer electrically contacting the first material barrier layer.

Embodiment (t). The method of any of embodiments (m) to (s), wherein a first portion of the N-type layer forms a monolithic body, and a second portion of the N-type layer in combination with the active region and the P-type layer form a plurality of mesas integral to the monolithic body, the N-bonding material directly contacts the first portion of the N-type layer, and each of the mesas has at least one characteristic dimension of less than 100 micrometers, the character dimension being selected from the group consisting of: height, width, and depth.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light emitting diode (LED) device comprising:
   semiconductor layers including an N-type layer, an active region, and a P-type layer;
   an N-bonding material electrically contacting the N-type layer, the N-bonding material being multi-layered and comprising:
      an ohmic contact layer directly on and electrically contacting the N-type layer and having a work function value that is less than or equal to a work function value of the N-type layer;
      a reflective layer directly on and electrically contacting the ohmic contact layer;
      a first N-bonding material barrier layer electrically contacting the reflective layer;
      a current carrying layer electrically contacting the first N-bonding material barrier layer; and
      a second N-bonding material barrier layer electrically contacting the current carrying layer;
   a P-bonding material electrically contacting the P-type layer and being isolated from the N-bonding material; and
   a first dielectric material which insulates the P-type layer and the active region from the N-bonding material.

2. The LED device of claim 1, wherein a thickness of the ohmic contact layer is less than or equal to 20% of a thickness of the reflective layer.

3. The LED device of claim 1, wherein:
   the ohmic contact layer comprises: aluminum (Al), titanium (Ti), or aluminum-doped zinc oxide (AZO),
   the reflective layer comprises silver (Ag) or gold (Au);
   the first and second N-bonding material barrier layers each independently comprise: titanium (Ti), chromium (Cr), platinum (Pt), cobalt (Co), palladium (Pd), or tungsten (W), and
   the current carrying layer comprises: copper (Cu), gold (Au), or aluminum (Al).

4. The LED device of claim 3, wherein the N-type layer comprises n-GaN.

5. The LED device of claim 1, wherein:
   the ohmic contact layer comprises a thickness in a range of greater than or equal to 5 Å to less than or equal to 200 Å,
   the reflective layer comprises a thickness of greater than or equal to 1000 Å,
   the first and second N-bonding material barrier layers each independently comprise a thickness of greater than or equal to 1000 Å, and the current carrying layer comprises a thickness of greater than or equal to 5000 Å.

6. The LED device of claim 1, wherein the N-bonding material further comprises a first N-bonding material migration suppression layer electrically contacting the reflective layer and the first material barrier layer; and a second N-bonding material migration suppression layer electrically contacting the current carrying layer and the second material barrier layer.

7. The LED device of claim 6, wherein the first and second N-bonding material migration suppression layers each independently comprise nickel (Ni) or palladium (Pd), and/or independently comprise a thickness in a range of greater than or equal to 50 Å to less than or equal to 1000 Å.

8. The LED device of claim 1, wherein the P-bonding material is the same as the N-bonding material.

9. The LED device of claim 1, wherein the semiconductor layers are on a substrate and the N-bonding material directly contacts the N-type layer, and the device further comprises an N-pad electrically contacting the N-bonding layer and a P-pad electrically contacting the P-bonding layer, and a second dielectric material which insulates the N-bonding material from the P-bonding material.

10. The LED device of claim 9, which is in a form of a chip scale package.

11. The LED device of claim 1, which is in a form of a monolithic array, wherein a first portion of the N-type layer forms a monolithic body, and a second portion of the N-type layer in combination with the active region and the P-type layer form a plurality of mesas integral to the monolithic body, the N-bonding material directly contacts the first portion of the N-type layer, and each of the mesas has at least one characteristic dimension of less than 100 micrometers, the character dimension being selected from the group consisting of: height, width, and depth.

12. A method of manufacturing a light emitting diode (LED) device comprising:
   preparing a plurality of semiconductor layers including an N-type layer, an active region, and a P-type layer;
   exposing the N-type layer;
   preparing an N-bonding material contacting the N-type layer by:
      depositing an ohmic contact layer directly on and electrically contacting the N-type layer and having a work function value that is less than or equal to a work function value of the N-type layer;
      depositing a reflective layer directly on and electrically contacting the ohmic contact layer;

depositing a first N-bonding material barrier layer electrically contacting the reflective layer;

depositing a current carrying layer electrically contacting the first material barrier layer; and depositing a second N-bonding material barrier layer electrically contacting the current carrying layer; and depositing a dielectric material which insulates the P-type layer and the active region from the N-bonding material.

13. The method of claim 12, wherein the N-type layer comprises n-GaN, and the ohmic contact layer comprises: aluminum (AI), titanium (Ti), or aluminum-doped zinc oxide (AZO); the reflective layer comprises silver (Ag) or gold (Au); the first and second material barrier layers each independently comprise: titanium (Ti), chromium (Cr), platinum (Pt), cobalt (Co), palladium (Pd), or tungsten (W); and the current carrying layer comprises: copper (Cu), gold (Au), or aluminum (Al).

14. The method of claim 12, wherein:

the ohmic contact layer comprises a thickness in a range of greater than or equal to 5 Å to less than or equal to 200 Å, the reflective layer comprises a thickness of greater than or equal to 1000 Å, the first and second material barrier layers each independently comprise a thickness of greater than or equal to 1000 Å, and the current carrying layer comprises a thickness of greater than or equal to 5000 Å.

15. The method of claim 12 further comprising: depositing a first material migration suppression layer electrically contacting the reflective layer and the first material barrier layer; and/or a second material migration suppression layer electrically contacting the current carrying layer and the second material barrier layer.

16. The method of claim 15, wherein the first and second material migration suppression layers each independently comprise nickel (Ni) or palladium (Pd), and/or independently comprise a thickness in a range of greater than or equal to 50 Å to less than or equal to 1000 Å.

17. The method of claim 12, wherein a P-bonding material is also prepared contacting the P-type layer by depositing the ohmic contact layer electrically contacting the P-type layer, depositing the reflective layer electrically contacting the ohmic contact layer, depositing the first N-bonding material barrier layer electrically contacting the reflective layer, depositing the current carrying layer electrically contacting the first material barrier layer.

18. The method of claim 12, wherein a first portion of the N-type layer forms a monolithic body, and a second portion of the N-type layer in combination with the active region and the P-type layer form a plurality of mesas integral to the monolithic body, the N-bonding material directly contacts the first portion of the N-type layer, and each of the mesas has at least one characteristic dimension of less than 100 micrometers, the character dimension being selected from the group consisting of: height, width, and depth.

* * * * *